United States Patent [19]

Marsh

[11] Patent Number: 5,079,509
[45] Date of Patent: Jan. 7, 1992

[54] SCALE FOR A MEASURING INSTRUMENT

[76] Inventor: Hugh R. Marsh, 28 Somler Close, Canterbury, Kent, England

[21] Appl. No.: 364,626

[22] Filed: Jun. 9, 1989

[30] Foreign Application Priority Data

Jun. 10, 1988 [GB] United Kingdom ............... 8813829

[51] Int. Cl.$^5$ .................. G01R 1/00; G01R 15/08
[52] U.S. Cl. ...................... 324/115; 324/99 D; 324/114; 324/116
[58] Field of Search .............. 324/115, 114, 99 D, 324/131, 132, 116; 340/753, 754; 116/DIG. 47, 334

[56] References Cited

U.S. PATENT DOCUMENTS

| | | | |
|---|---|---|---|
| 2,509,415 | 5/1950 | Bernreuter | 324/115 |
| 3,611,131 | 10/1971 | Burkhart et al. | 324/115 |
| 3,726,250 | 4/1973 | Merk | 340/753 |
| 4,174,500 | 11/1979 | Kuga | 324/115 |
| 4,463,355 | 7/1984 | Schultz et al. | 340/754 |
| 4,748,404 | 5/1988 | Heinze et al. | 324/115 |
| 4,789,824 | 12/1988 | Henkelmann | 324/115 |
| 4,795,972 | 1/1989 | Roppelt et al. | 324/115 |
| 4,968,930 | 11/1990 | Grupp et al. | 324/115 |

FOREIGN PATENT DOCUMENTS

| | | | |
|---|---|---|---|
| 2313663 | 6/1976 | France. | |
| 0124090 | 9/1980 | Japan | 340/753 |
| 56-138211 | 1/1982 | Japan. | |
| 59-187219 | 2/1985 | Japan. | |

*Primary Examiner*—Kenneth A. Wieder
*Assistant Examiner*—Vinh P. Nguyen
*Attorney, Agent, or Firm*—Poms, Smith, Lande & Rose

[57] ABSTRACT

A scale is disclosed for a measuring instrument in which a plurality of display elements, specifically liquid crystal display elements which are energizable to a visible condition or an enhanced visible condition selectively to provide a linear scale or a logarithmic scale. The scale is divided into decades which specifically have twelve display elements of which ten are selectively energizable to provide the linear scale and then to provide the logarithmic scale.

8 Claims, 2 Drawing Sheets

SCALE FOR A MEASURING INSTRUMENT

TECHNICAL FIELD

This invention relates to improvements in measuring instruments and is particularly concerned with providing an improved scale for displaying the magnitude of a parameter measured by the instrument.

BACKGROUND ART

Multi-purpose and multi-function measuring instruments are known which measure more than one parameter or more than one order of magnitude and which require a logarithmic scale for one parameter and a linear scale for another. Such scales usually appear together on the face of the instrument and are swept by a pointer to give an analogue reading of the parameter being measured. The user reads this magnitude off the scale which is known to have been selected. Such instruments are also known which provide a digital readout and in this case the analogue magnitude which is measured is converted electronically to digital form and is electronically scaled to be logarithmic or linear or to represent the correct order of magnitude.

It is an object of the present invention to provide an improved scale for a measuring instrument which enables only one scale to be visible at a time and which enables a logarithmic function or a linear function to be displayed as required.

SUMMARY OF THE INVENTION

The present invention, broadly stated, provides a scale for a measuring instrument in which the scale is a liquid crystal display, the elements of which can be selectively energised to make visible a logarithmic scale or a linear scale.

The invention more specifically provides a scale for a measuring instrument comprising a plurality of display elements which are energisable to a visible condition or an enhanced visible condition and which divide the scale into a plurality of substantially equal sections or decades and which sub-divide each section or decade into a plurality of substantially equal sub-sections to provide a linear scale and at least two additional display elements in each section towards the end of increasing magnitude to transform the linear scale into a substantially logarithmic scale.

The scale can be of rectilinear or curved configuration but, as will be apparent hereafter, a flattened arcuate configuration is preferred.

The scale is divided into a number of decades each of which is divided into ten substantially equal segments. For the purpose of the logarithmic scale, the last two segments of the ten segments in the direction of increasing magnitude are each further divided into two sections. The scale therefore is represented by 12 liquid conducting display elements per decade of which ten are selectively energised to display a substantially logarithmic scale or a substantially linear scale.

Considered in the direction of increasing magnitude on the logarithmic scale, and considering the first display element defining the beginning of the decade to be the first, the sixth and the eighth liquid conducting display element are each supplemented by a separate further element which can be energised to increase their apparent length to emphasise the half-way stage of the decade. Thus the sixth will denote the half-way of a decade on the linear scale and the eighth will denote the half-way on the logarithmic scale.

Further liquid crystal display elements may be provided to further sub-divide the decades to give readings of an enhanced order of accuracy, particularly if a moving pointer is to be used. It is, however, preferred to provide liquid crystal display elements as pointers which, when energised point to the scale to identify the magnitude being measured and, as the space available for such elements is limited, they are preferably limited to ten, each pointing to a sub-division on the linear scale.

If ten segments are used per decade on the logarithmic scale (counting the first segment but not the las which is the first segment of the next following decade), quantised points are as follows: (1.00) (1.26) (1.58) (2.0) (2.51) (3.16) (3.98) (5.01) (6.31) (7.94). Ideal points would be: (1.00) (1.25) (1.50) (2.0) (2.5) (3.0) (4.0) (5.0) (6.0) (8.0).

The similarity between the sequence achieved and the ideal sequence is remarkable. Seven points line up to within 1% and the other three show errors of 5%. Furthermore the points of greatest interest in measuring insulation are 1MΩ, 0.5 MΩ ahd 0.25 MΩ and these are accurate to within 0.4%.

Accuracy can be improved by using 20 segments which would give a sequence including the points (7.0) and (9.0) but such an improvement is minor and generally not worth the added expense.

The invention extends to a measuring instrument incorporating a liquid crystal display scale as mentioned above and such an instrument may, with advantage, also incorporate a liquid crystal digital display of the magnitude being measured. This would increase the cost of the instrument but would increase the accuracy of the reading if this were required.

One embodiment of the invention will now be described by way of example, reference being made to the accompanying drawings.

BEST MODE FOR CARRYING OUT THE INVENTION

Figure 1:
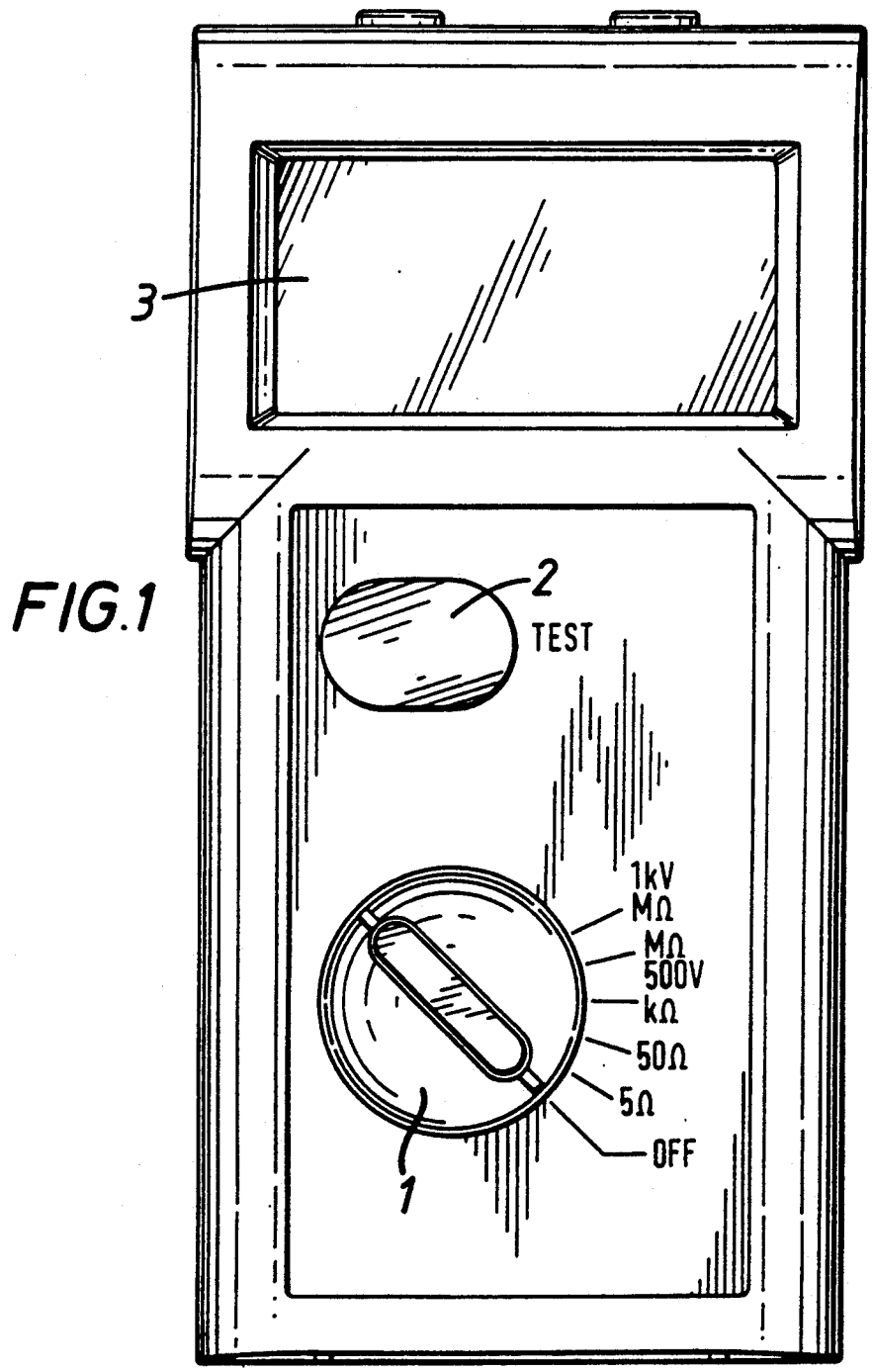
FIG. 1 is an elevational front view of a measuring instrument embodying a scale according to the present invention.

The measuring instrument illustrated in FIG. 1 is an electrical battery operated measuring instrument of a size and configuration which enables it to be conveniently hand-held and placed on a table or other supporting surface. It has a rotatable selector knob 1 which selects the parameter to be measured, e.g. resistance or voltage, and also the order of magnitude, e.g. ohms, kilo-ohms or mega-ohms. There is also a test button 2 which is depressed when the measurement is to be made and which will render the instrument active for a given period of time, e.g. 15 minutes.

Actuation of the test button 2 and also an angular displacement of the knob 1 from one range to the next generates a reset pulse which restarts the software in the instrument for the range selected and activates the liquid crystal display elements for the scale which becomes visible in the window 3.

Figure 2:
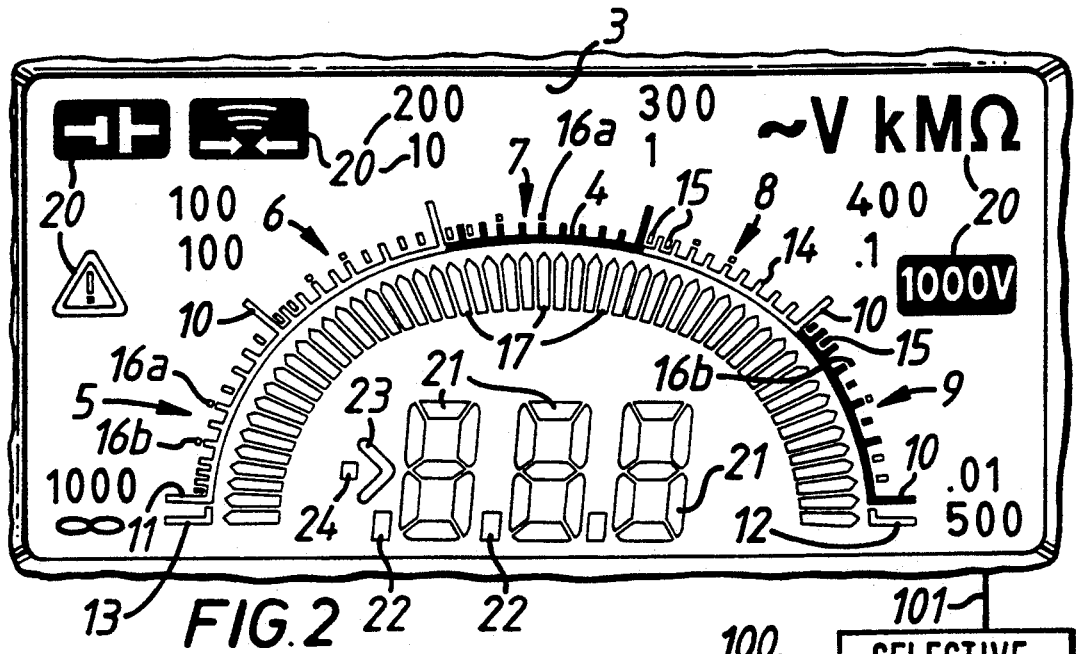
FIG. 2 is a representation of a scale according to the invention with one decade illustrating a logarithmic scale and another illustrating a linear scale.

Referring to FIG. 2 it can be seen that the scale is in the form of a flattened arc 4 provided by liquid crystal display elements and divided into what may be termed decades because there are ten segments in each decade, whether it be for a logarithmic or a linear scale. There could be multiples of ten segments in each decade but this is not considered necessary. These decades are generally indicated by the reference numerals 5, 6, 7, 8 and 9. Although the scale is in the form of a flattened arc it could be rectilinear or take another configuration. Considered in the anti-clockwise direction, which is the direction of increase for the logarithmic scale, each decade commences with an elongate display element 10. The end of a decade is marked by a similar elongate display element 10 which marks the commencement of the next decade. The scale terminates with an end elongate display element 11 and there are similar elongate display elements 12 and 13 immediately before the first element 10 and after the element 11 which are really cosmetic as they are used to denote a resistance of infinity or a resistance less than 0.01 MΩ or 0.01 kΩ.

Each decade is sub-divided in ten substantially equal segments by display elements 14 which extend a uniform distance away from and outwardly of the arc 4. The last two segments in the anti-clockwise direction are each further sub-divided in two substantially equal smaller segments by further display elements 15 which extend outwardly for substantially the same distance as the display elements 14. Including the first elongate display element 10 (and excluding the last which represents the first element of the next decade), each decade has twelve display elements, i.e. the first element 10, nine elements 14 and two elements 15. Also, including the first display element 10, the sixth and eighth elements are capable of being extended by supplementary elements 16a and 16b the 16a element being energised to mark the half-way stage of a decade on a linear scale and the 16b element being energised to mark the half-way stage on a logarithmic scale.

Decade 7 shows by solid lines, the display elements which are energised to provide a linear scale. It will be noted that in this case, the two elements 15 have not been energised and are not visible whilst supplemental element 16a has been energised. Decade 9, similarly, shows by solid lines the display elements which are energised to provide a logarithmic scale and it will be noted that the two elements 15 have been energised and are visible and the first two elements 14 in the anti-clockwise direction have not been energised although it could have been the first and the fourth elements not energised.

In order to indicate the magnitude of the parameter being measured, a number of pointers 17 are provided inwardly of the arc 4 and provided by a liquid crystal display element. There are, in this example, ten such display element pointers 17 for each decade and each is directed towards a gradation on the linear scale which means there is no display element pointer 17 directed towards the two display elements 15. As mentioned above, these represent the points 7.0 and 9.0 and could be included by having twenty pointers 17 but this is not considered to be worth the additional expense.

FIG. 2 also shows other symbols indicated by the reference numeral 20, including the scale values, which are represented by liquid crystal display elements and which can be energised to become visible by the reset pulse generated upon operation of the knob 1 to select the scale and parameter to be measured.

As will be appreciated from the above description, the present invention provides a scale for a measuring instrument where the scale is composed of liquid crystal display elements which can be selectively energised to provide a logarithmic scale or a linear scale so that only one is visible at a time. The scale is arranged as a number of decades or sections of equal length each of which is sub-divided by gradations to provide a logarithmic sub-scale which, when some of the display elements of the gradations are not energised, provide a linear scale which sub-divides the decades or sections into equal portions, preferably ten. A corresponding number of pointers is provided in association with each decade or section, each such pointer being associated with and directed towards a corresponding gradation on the linear sub-scale.

Figure 3:
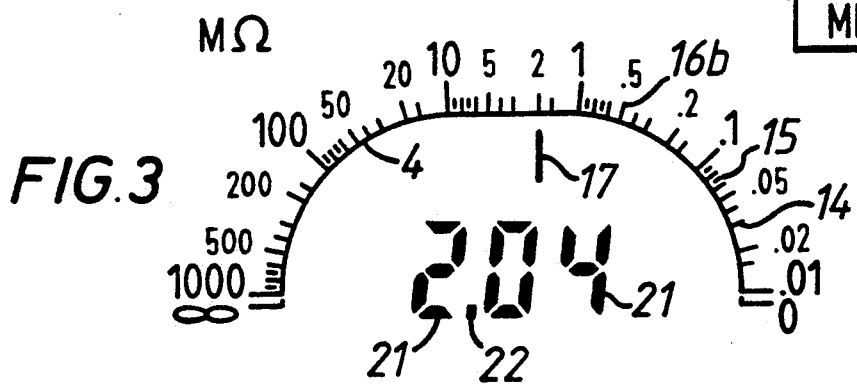
FIG. 3 to a smaller scale, illustrates the scale of FIG. 1 as a logarithmic scale measuring MΩ in both analogue and digital form.
Figure 4:
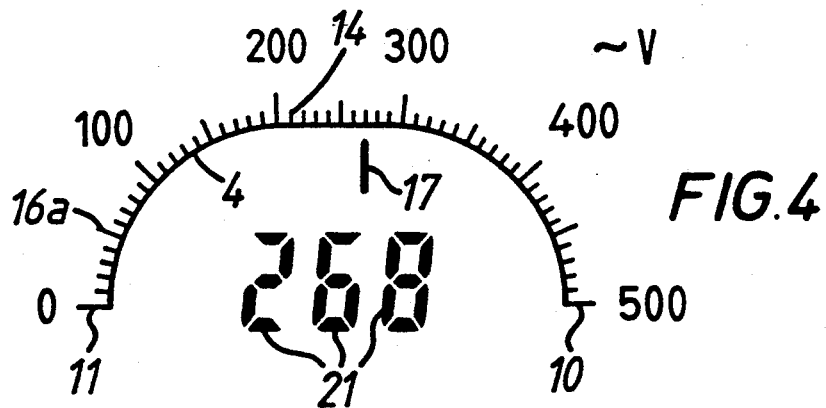
FIG. 4 is a view similar to FIG. 3 illustrating the scale being used as a linear scale to measure voltage.

The instrument may also include a digital read-out as shown in FIGS. 2, 3 and 4. As shown in FIG. 2, provision is made for three digits by the liquid crystal display elements 21 and also three decimal points 22. Provision for a fourth sub-digit could also be made if required. Also available, if required is the sign 23 for "greater than" and a minus sign 24. A digital read-out increases the cost of the instrument but also increases the accuracy of the reading available as will be apparent from FIGS. 3 and 4.

Any suitable selective energizing means 100 (FIG. 2) operatively connected to the scale by conduit 101 may be used to selectively energize the display element to make visible or enhance the visibility of the linear scale and the logarithmic scale.

The measuring system may be arranged to energise all or some of the display element pointers 17 in the direction of increasing magnitude up to the value being measured effectively to provide a solid visible bar up to that point. In this case it is advantageous to provide each display pointer 17 with a separate energisable tail and to energise the tail of that pointer 17 of the bar which is directed to the magnitude being measured so as to emphasise this. Alternatively, only the pointer directed towards the magnitude being measured may be energised.

It will be appreciated that the position of the symbols 20 in the window 3 is largely a matter of design choice.

It is preferred that the display should provide reflective dark characters on a light background.

It will also be appreciated that the scales provided can be of increasing magnitude in either direction.

What is claimed is:

1. A scale for a measuring instrument comprising a first plurality of display elements which are energizable to a visible condition or an enhanced visible condition and which divide the scale into a plurality of substantially equal sections or decades and which sub-divide each section or decade into a plurality of substantially equal sub-sections to provide a linear scale when energized and at least two additional display elements in each section towards the end of increasing magnitude which when energized transform the linear scale into a substantially logarithmic scale.

2. A scale according to claim 1 including a pointer plurality of display pointer elements which are energisable to a visible condition or an enhanced visible condition and which are arranged as pointers directed towards the sub-sections of the linear scale and which correspond in number to the number of sub-sections.

3. A scale according to claim 1 or 2 in which the display elements, said at least two additional display elements and said pointer display elements are liquid crystal display elements.

4. A scale according to claim 1 in which twelve display elements are provided per decade of which ten of said first plurality are selectively energizable to provide a substantially linear scale and two of said additional elements in combination with eight of said first plurality of elements are selectively energizable to provide a substantially logarithmic scale.

5. A scale according to claims 1 or 4 in which said scale is of a flattened arc configuration.

6. A scale according to claim 4 in which said two additional display elements are positioned to subdivide the last two of the equal sub sections of each section or decade considered in the direction of increasing magnitude of the logarithmic scale.

7. A scale according to claim 4 in which said twelve display elements include a first display element at the commencement of each decade considered in the direction of increasing magnitude on the logarithmic scale, a sixth display element considered in said direction and representing the half-way stage of the decade on the linear scale and an eighth display element considered in said direction and representing the half way stage of the decade on the logarithmic scale and a separate further display element associated with said sixth display element and a separate further display element associated with said eighth display element, each of said further display elements being selectively energizable to increase the apparent length of said sixth and eighth display elements, respectively to emphasize the half-way stage of the respective decade.

8. In a measuring instrument, a scale comprising a first plurality of display elements which are energizable to a visible condition or an enhanced visible condition and which divide the scale into a plurality of substantially equal sections or decades and which sub-divide each section or decade into a plurality of substantially equal sub-sections to provide a linear scale when energized and at least two additional display elements in each section towards the end of increasing magnitude which when energized transform the linear scale into a substantially logarithmic scale and means operatively connected to said scale for selectively energizing the display element to make visible or enhance the visibility of the linear scale and the logarithmic scale.

* * * * *